US011067622B2

United States Patent
Bagung et al.

(10) Patent No.: US 11,067,622 B2
(45) Date of Patent: Jul. 20, 2021

(54) PRINTED CIRCUIT BOARD WITH A BENT CONNECTING SECTION AND METHOD FOR TESTING AND PRODUCING SAID PRINTED CIRCUIT BOARD, AND ALSO ELECTRONIC CONTROL UNIT AND METHOD FOR OPERATING SAID ELECTRONIC CONTROL UNIT

(71) Applicant: VITESCO TECHNOLOGIES GMBH, Hannover (DE)

(72) Inventors: Detlev Bagung, Bernhardswald (DE); Hubert Horn, Landshut (DE)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 16/340,395

(22) PCT Filed: Sep. 6, 2017

(86) PCT No.: PCT/EP2017/072288
§ 371 (c)(1),
(2) Date: Apr. 9, 2019

(87) PCT Pub. No.: WO2018/068948
PCT Pub. Date: Apr. 19, 2018

(65) Prior Publication Data
US 2019/0235016 A1 Aug. 1, 2019

(30) Foreign Application Priority Data
Oct. 10, 2016 (DE) .......................... 102016219620.0

(51) Int. Cl.
*G01R 31/28* (2006.01)
*H05K 1/02* (2006.01)
*H05K 3/46* (2006.01)

(52) U.S. Cl.
CPC ..... *G01R 31/2818* (2013.01); *G01R 31/2812* (2013.01); *H05K 1/0268* (2013.01);
(Continued)

(58) Field of Classification Search
CPC ............ G01R 31/2812; G01R 31/2818; H05K 1/028; H05K 1/181; H05K 1/0268;
(Continued)

(56) References Cited

U.S. PATENT DOCUMENTS 5,834,705 A * 11/1998 Jonaidi ................. H05K 1/141
174/261
7,304,481 B2 12/2007 Wu et al.
(Continued)

FOREIGN PATENT DOCUMENTS

CN          1930931 A     3/2007
CN         100489549 C     5/2009
(Continued)

*Primary Examiner* — Minh N Tang
(74) *Attorney, Agent, or Firm* — Laurence A. Greenberg; . H. Sterner; Ralph E. Locher

(57) ABSTRACT

A method for testing a printed circuit board includes providing a printed circuit board having a first main section, a second main section, a bent connecting section and at least one monitoring conductor track. The connecting section is disposed between the first main section and the second main section. The monitoring conductor track runs from the first main section, in a curved manner through the connecting section, to the second main section. At least one electrical measurement value which is representative of the integrity of the at least one monitoring conductor track is detected. A printed circuit board, a control unit and methods for producing the printed circuit board and for operating the control unit are also provided.

21 Claims, 2 Drawing Sheets

(52) U.S. Cl.
CPC ......... *H05K 1/0278* (2013.01); *H05K 3/4691* (2013.01); *H05K 2201/0382* (2013.01); *H05K 2203/162* (2013.01); *H05K 2203/302* (2013.01)

(58) Field of Classification Search
CPC ...... H05K 1/0278; H05K 1/0393; H05K 3/14; H05K 3/284; H05K 3/303; H05K 3/4691; H01R 12/7041; H01R 12/7047
See application file for complete search history.

(56) References Cited

U.S. PATENT DOCUMENTS

| | | | | |
|---|---|---|---|---|
| 7,495,450 B2 * | 2/2009 | Furse | ..................... | G01R 31/11 324/519 |
| 8,624,130 B2 * | 1/2014 | Bagung | ................. | H05K 1/028 174/261 |
| 8,975,527 B2 * | 3/2015 | Takaoka | ................. | H05K 1/028 174/254 |
| 9,065,222 B2 | 6/2015 | Drew et al. | | |
| 9,395,401 B2 | 7/2016 | Jiang et al. | | |
| 9,474,149 B2 | 10/2016 | Woelfel | | |
| 2014/0120749 A1 * | 5/2014 | Drew | ................... | H05K 1/0278 439/78 |

FOREIGN PATENT DOCUMENTS

| | | |
|---|---|---|
| CN | 101846709 A | 9/2010 |
| CN | 103675581 A | 3/2014 |
| CN | 103796427 A | 5/2014 |
| CN | 104798449 A | 7/2015 |
| DE | 4113606 C1 | 8/1992 |
| DE | 20210025 U1 | 8/2003 |
| DE | 102012013347 A1 | 1/2014 |
| EP | 1575344 A1 | 9/2005 |
| EP | 2728983 A1 | 5/2014 |
| WO | 2005089033 A1 | 9/2005 |

* cited by examiner

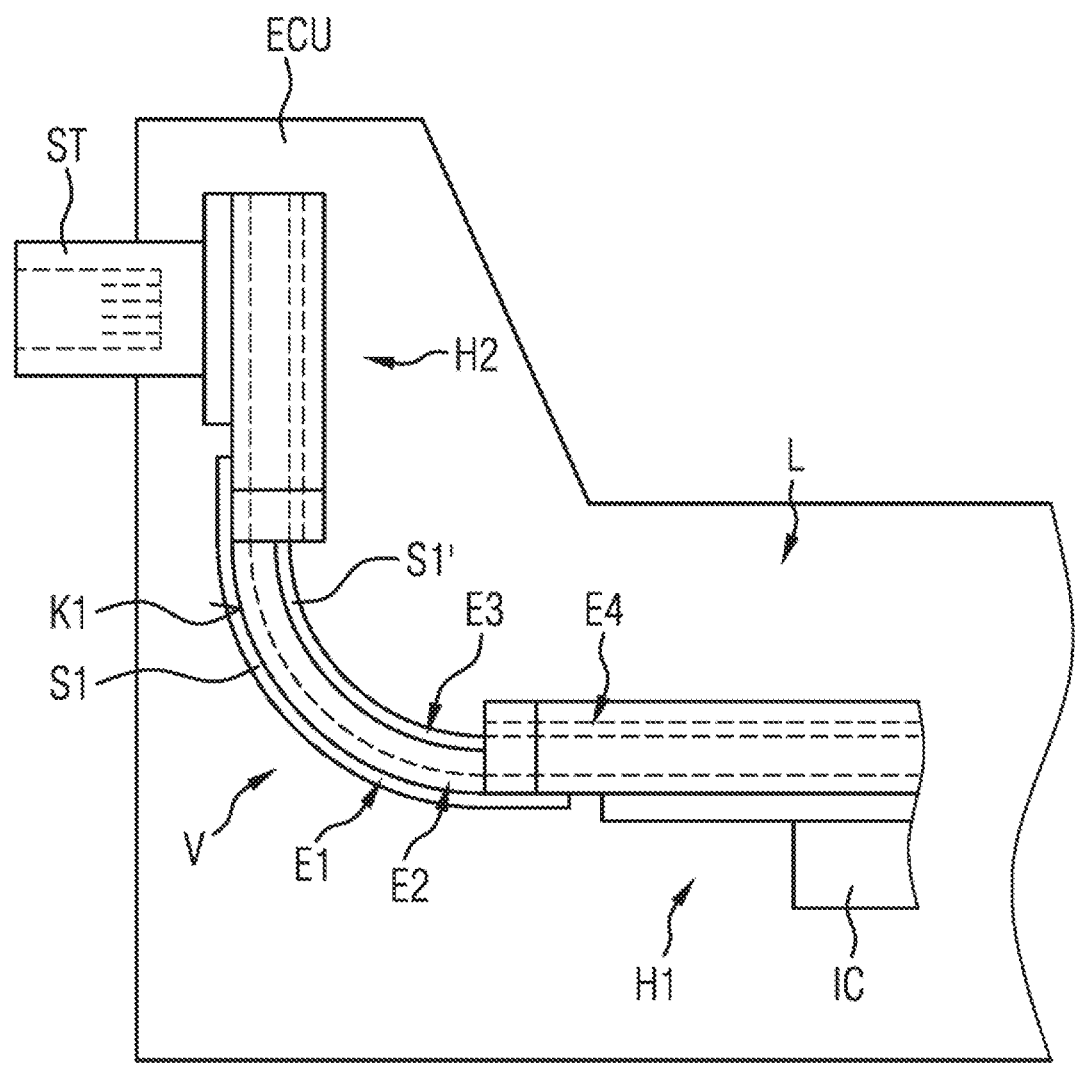

PRINTED CIRCUIT BOARD WITH A BENT CONNECTING SECTION AND METHOD FOR TESTING AND PRODUCING SAID PRINTED CIRCUIT BOARD, AND ALSO ELECTRONIC CONTROL UNIT AND METHOD FOR OPERATING SAID ELECTRONIC CONTROL UNIT

BACKGROUND OF THE INVENTION

Field of the Invention

The present invention relates to a method for testing a printed circuit board having a bent connecting section, to a method for producing a printed circuit board having a bent connecting section, to a method for operating an electronic control unit, and also to a printed circuit board having a bent connecting section and to a control unit.

By way of example, document WO 2005/089033 A1 discloses a printed circuit board which has a section which is flexible, so that the printed circuit board can be bent and, after being bent, remains in the shape into which it was bent.

One problem faced in printed circuit boards of this kind is that, after bending, it is not possible to check using conventional methods whether the bending point was damaged during bending. Damage to the bending point is not detectable during manufacture.

SUMMARY OF THE INVENTION

Therefore, one object of the present disclosure is to provide a method for testing a printed circuit board having a bent connecting section. A further object of the present disclosure is to provide a method for producing a printed circuit board having a bent connecting section, by means of which method damage during bending of the connecting section can be determined in a particularly simple manner. A further object of the present invention is to provide a method for operating a control unit, in which method damage to a bent connecting section of a printed circuit board during operation of the control unit can be detected in a simple manner. Further objects are those of providing an improved printed circuit board and also an improved control unit.

These objects are achieved by the methods, the printed circuit board and the control unit as claimed in the independent patent claims. Advantageous refinements and developments of the methods, of the printed circuit board and of the control unit can be found in the respectively dependent claims, the following description and the drawings.

One aspect of the present disclosure specifies a printed circuit board.

The printed circuit board has a first main section, a second main section, a bent connecting section and at least one monitoring conductor track. The connecting section is arranged between the first main section and the second main section. In other words, the first main section, the bent connecting section and the second main section follow one another in this order. The monitoring conductor track runs from the first main section, in a curved manner through the connecting section, to the second main section.

The first main section and the second main section are, in particular, mechanically and electrically conductively connected to one another by means of the connecting section. The connection can expediently be designed by means of the bent connecting section in such a way that a main plane of extent of the first main section runs in an inclined manner to a main plane of extent of the second main section. In particular, the main planes of extent of the main sections are perpendicular to one another. The main planes of extent are, in particular, parallel to the circuit planes and/or to a main surface of the respective section which is intended to be populated. The first main section, the connecting section and the second main section are, in particular, of integral design, that is to say preferably formed from a single, common printed circuit board main body. In particular, for forming the connecting section, the thickness of the printed circuit board main body is reduced in one region—for example by means of milling, so that the remaining regions of original thickness of the printed circuit board main body form the main sections.

In one refinement, the main sections of the printed circuit board have a rectangular basic shape in plan view of the respective main planes of extent. The main sections preferably have the same thickness. Here, the width is the dimension in the direction which, in plan view of the printed circuit board in the extended state, is perpendicular to that direction in which the first main section, the connecting section and the second main section follow one another. In particular, the printed circuit board overall has a basic shape which is rectangular—in plan view of the main planes of extent in the extended state.

A further aspect of the present disclosure specifies a method for testing the printed circuit board. The printed circuit board having the bent connecting section, the two main sections and the at least one monitoring conductor track is provided in one step of the method. At least one electrical measurement value which is representative of the integrity of the at least one monitoring conductor track is detected in a further step of the method.

A further aspect of the present disclosure specifies a method for producing the printed circuit board. The method for producing the printed circuit board comprises the method for testing the printed circuit board. It additionally comprises a method step which precedes providing a printed circuit board having the bent connecting section, in which preceding method step the connecting section is bent, so that the at least one monitoring conductor track is curved. The connecting section is bent, in particular, starting from a flat state. The measurement value is detected in the method after bending of the connecting section.

Another aspect of the invention specifies a method for operating an electronic control unit which has the printed circuit board and also an integrated circuit which is arranged on the first main section. The method for operating the electronic control unit comprises the method for testing the printed circuit board, wherein the measurement value is detected by means of the integrated circuit during operation of the control unit.

In addition, a further aspect specifies a control unit having the printed circuit board, which control unit is designed for detecting at least one electrical measurement value which is representative of the integrity of the at least one monitoring conductor track. The control unit is preferably an electronic control unit, in particular for a motor vehicle. By way of example, said control unit is an engine and/or transmission control unit.

Particularly simple detection of damage to the connecting section is advantageously possible by means of the monitoring conductor track. Contact can be made with the monitoring conductor track for testing purposes both during production of the printed circuit board and also during operation of a control unit having the printed circuit board, so that the state of the connecting section can be evaluated during the entire life cycle of the printed circuit board. In particular, the connecting section can be checked for damage during production of the printed circuit board after bending of the connecting section. In addition, the connecting section can further be examined for damage in the completed control unit during operation of the control unit too, for example for cracks which damage the monitoring conductor track due to vibrations of the control unit during operation in a motor vehicle.

The electrical measurement value which is representative of the integrity of the at least one monitoring conductor track is, for example, the electrical resistance of the monitoring conductor track. If the measurement value deviates from a prespecified setpoint value by more than a predetermined amount—if, for example, the electrical resistance falls below a prespecified resistance setpoint value—, the structural and/or electrical integrity of the monitoring line is adversely affected.

In a preferred refinement, the connecting section of the printed circuit board is of semi-flexible design. This is achieved, in particular, in that the connecting section has a thickness which is reduced in relation to the main sections and contains a glass fiber-reinforced resin. The thickness is, in particular, the extent perpendicular to the main plane of extent of the main sections in the extended state of the printed circuit board, that is to say given parallel orientation of the main sections. Connecting sections of semi-flexible design of this kind are at a comparatively high risk of being damaged during bending. In particular, there is a risk of cracks forming during bending, for example in the glass fiber-reinforced resin, which cracks can damage the conductor tracks of the printed circuit board. Damage due to cracks of this kind can be particularly easily and reliably detected by means of the monitoring conductor track(s).

The fact that the connecting section is "semi-flexible" means, in particular, that it can be curved. For example, said connecting section can be shaped in such a way that it can be changed over from an extended shape into a bent shape by bending—for example by means of the action of force onto the main sections of the printed circuit board. Here, the printed circuit board is designed for at least one, and in particular for at most 20, for example at most ten, bending cycles. Here, the connecting section is, on account of its semi-flexible design, dimensionally stable preferably in such a way that it remains in the bent shape after bending without the action of external forces (apart from the weight force of the printed circuit board) and as a result fixes the orientation of the main sections—in particular the angles of inclination thereof—in relation to one another.

In the present context, a "glass fiber-reinforced resin" is understood to mean a fiber/resin composite comprising a resin and glass fibers. The resin is, for example, a thermosetting material such as polyester resin or, preferably, epoxy resin. The glass fiber-reinforced resin forms, in particular, the main body of the printed circuit board, at least in the region of the connecting section, preferably also in the region of the main sections.

In one refinement, the connecting section has a plurality of circuit planes. The main sections also preferably have the plurality of circuit planes. In one development, the first and/or the second main section contain/contains at least one additional circuit plane which does not extend into the connecting section or extends beyond said connecting section to the other main section. The at least one additional circuit plane can expediently be arranged in a position of the printed circuit board main body which is removed at points in order to reduce the thickness of the connecting section during production of the printed circuit board.

The circuit planes are, in particular, circuit planes which are stacked one above the other and of which at least one circuit plane runs in the interior of a main body of the printed circuit board. In this case, electrical connection conductors are expediently drawn from the circuit plane/planes, which run in the interior of the main body, to an outer face of the printed circuit board and connected to electrical connection points there. The circuit planes having the electrical conductor tracks of the printed circuit board are, in particular, embedded into the glass fiber-reinforced resin of the printed circuit board and/or applied to it.

In one development, each of the circuit planes of the connecting section contains a monitoring conductor track. In this case, the method step in which at least one electrical measurement value which is representative of the integrity of the at least one monitoring conductor track is detected expediently comprises detecting a measurement value which is representative of the integrity of each of the monitoring conductor tracks. In this way, damage which does not extend over the entire thickness of the connecting section can advantageously be detected in a particularly reliable manner.

In one refinement, the width of the at least one monitoring conductor track is increased in size in a transition region from the connecting section to the first main section and in a transition region from the connecting section to the second main section. In this way, a particularly reliable electrical contact is advantageously made with the monitoring conductor track and/or a particularly high degree of sensitivity of the monitoring conductor track to damage to the connecting section can be achieved.

For example, the connecting section has a width which is reduced in relation to the main sections, so that at least a first of its longitudinal edges is offset in relation to the longitudinal edges of the main sections with respect to the opposite, second longitudinal edge. For example, that edge of the monitoring conductor track which faces the first longitudinal edge—or, in the case of a plurality of monitoring conductor tracks, of a first of the monitoring conductor tracks—follows the contour which is formed by the longitudinal edges of the main sections and by the first longitudinal edge of the connecting section. That edge of the monitoring conductor track which is averted from the first longitudinal edge can run, for example, in a straight line. For example, in this way, the monitoring conductor track can have a central region with a width which is reduced in relation to its end regions.

The longitudinal edges of the connecting section here are the edges of the connecting section which run from the first to the second main section, in particular in plan view of the main plane of extent of the printed circuit board in the extended state. The longitudinal edges of the main sections are the edges which run away from the connecting section and from the respectively other main section.

In one refinement, the printed circuit board has a large number of signal lines. Here, the monitoring conductor track—or, in the case of a plurality of monitoring conductor tracks, a first of the monitoring conductor tracks—runs along a longitudinal edge—in particular the above-mentioned first longitudinal edge—of the connecting section and is arranged between the signal lines and the longitudinal edge. None of the conductor tracks of the printed circuit board follow the monitoring conductor track in the direction of the longitudinal edge.

The printed circuit board preferably has a plurality of monitoring conductor tracks, wherein the plurality of monitoring conductor tracks contain, in particular, the abovementioned first monitoring conductor track and also a second monitoring conductor track. The method step in which at least one electrical measurement value which is representative of the integrity of the at least one monitoring conductor track is detected in this case expediently comprises—in particular in addition to detecting a measurement value which is representative of the integrity of the first monitoring conductor track—detecting a measurement value which is representative of the integrity of the second monitoring conductor track.

The second monitoring conductor track preferably runs along a second longitudinal edge, which is situated opposite the first longitudinal edge, in such a way that the monitoring conductor track precedes the signal lines and the second monitoring conductor track follows the signal lines in the direction from the first longitudinal edge to the second longitudinal edge. With preference, none of the conductor tracks of the printed circuit board follow the second monitoring conductor track in the direction of the longitudinal edge.

Particularly in the case of semi-flexible connecting sections, there is a comparatively high risk of the integrity of the connecting section being adversely affected by cracks which extend inward from the longitudinal edges of the connecting section into the printed circuit board. By way of the first or the first and the second monitoring conductor track, which is the first conductor track of the connecting section which follows the respective longitudinal edge, cracks of this kind can be detected—for example during operation of the control unit having the printed circuit board—before they have spread so far into the interior of the printed circuit board that signal lines of the printed circuit board are damaged or interrupted. Therefore, it is possible to replace the control unit before an uncontrolled functional breakdown.

In one refinement, the control unit has the printed circuit board and also at least one plug-in connector and one integrated circuit. The integrated circuit is arranged on the first main section of the printed circuit board. The plug-in connector is preferably fastened to the second main section such that the signal lines are connected to external electrical connections of the plug-in connector, and the monitoring conductor track and the second monitoring conductor track are DC-isolated from the at least one plug-in connector. In this way, signal transmission by means of the plug-in connector can be unaffected whereas the monitoring conductor track is already damaged and therefore an adverse effect on the integrity of the printed circuit board can already be detected.

In one refinement, the method for operating the control unit comprises a method step in which the at least one measurement value is analyzed by means of the integrated circuit and a further method step in which an output signal which is representative of the integrity of the at least one monitoring conductor track is provided by the control unit. The output signal can be provided, for example, by means of the plug-in connector.

BRIEF DESCRIPTION OF THE SEVERAL VIEWS OF THE DRAWING

Further advantages and advantageous refinements and developments of the methods, the printed circuit board and the control unit can be found in the following exemplary embodiments which are illustrated in connection with the figures, in which:

FIG. 2 shows a schematic sectional illustration of a detail of a control unit according to one exemplary embodiment.

DESCRIPTION OF THE INVENTION

Figure 1:
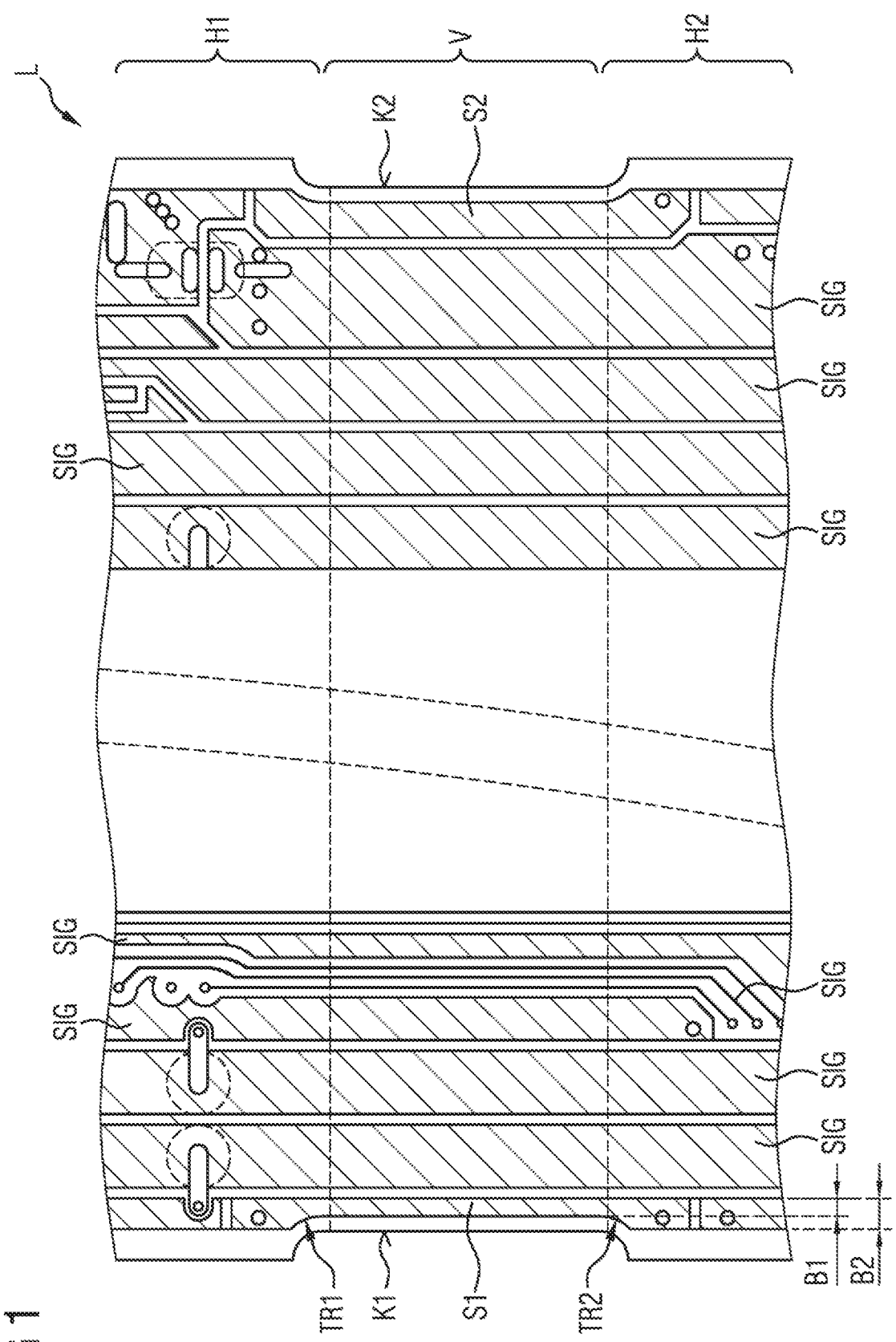
FIG. 1 shows a plan view of a detail of a printed circuit board during one stage of a method for producing said printed circuit board according to one exemplary embodiment.

Identical or similar elements or elements which act in an identical manner are provided with the same reference symbols throughout the figures. In some figures, individual reference symbols can be omitted in order to improve clarity. The figures and the size ratios of the elements illustrated in FIG. 2 with respect to one another are not to be considered to be true to scale. Instead, individual elements can be illustrated with an exaggerated size for better illustration and/or for better understanding.

FIG. 1 shows a plan view of a printed circuit board L according to one exemplary embodiment of the invention during one stage of a method according to the invention for producing said printed circuit board. For improved clarity of the figure, conductor tracks of the printed circuit board L are illustrated in hatched fashion in FIG. 1 and regions between the conductor tracks are not hatched.

FIG. 2 shows a schematic sectional illustration of an electronic control unit ECU according to an exemplary embodiment of the invention which contains the completed printed circuit board L.

The printed circuit board L has a first main section H1 which is intended to be populated with electronic components. By way of example, said first main section is populated with an integrated circuit IC.

In addition, the printed circuit board L has a second main section H2 which is populated, for example, with a plug-in connector ST. In the present case, the plug-in connector ST is intended for external electrical connection of the control unit ECU and can be connected, for example, to a cable harness of a motor vehicle.

The printed circuit board L has a connecting section V between the first main section H1 and the second main section H2, which connecting section extends from the first main section H1 to the second main section H2 and connects said main sections.

Only a detail of the printed circuit board is illustrated in FIG. 1. In the direction in which the first main section H1, connecting section V and second main section H2 follow one another, the main sections are cut off at the sides which are averted from the connecting section V in FIG. 1. In the direction of the width extent of the printed circuit board L which is perpendicular to said direction, a central region is indicated only roughly (dashed lines), without the layout of the printed circuit board being presented in detail in FIG. 1.

The main sections H1, H2 and also the connecting section V are regions of the printed circuit board L which are integrally formed from the same printed circuit board main body which is formed from glass fiber-reinforced resin. The connecting section V has a thickness which is reduced in relation to the main sections H1, H2 (see FIG. 2) and is produced, in particular, by deep milling the printed circuit board main body. "Deep milling" is understood to mean, in particular, removal of one or more layers of the printed circuit board at points for forming a trench in the printed circuit board main body.

In addition, the connecting section V has a width which is reduced in comparison to the main sections H1, H2 in the present case: the mutually opposite longitudinal edges K1, K2 of the connecting section are offset in relation to the longitudinal edges of the main sections H1, H2 with respect to the center of the printed circuit board L.

The printed circuit board L is designed such that it can be curved or is flexible by means of the semi-flexible connecting section V. During the method for producing the printed circuit board L—starting from the extended state of the printed circuit board L illustrated in FIG. 1—the second main section H2 is inclined in relation to the first main section H1 by way of the connecting section V being bent.

In this way, the connecting section acquires the curved shape illustrated in FIG. 2. The main planes of extent of the main sections H1, H2 no longer coincide as in the stage of the production method shown in FIG. 1, but rather are inclined in relation to one another. They are preferably perpendicular to one another, as illustrated in FIG. 2.

During bending, the connecting section V of the printed circuit board L is subjected to comparatively high mechanical loading. The structural integrity of said connecting section may be adversely affected in the process. In particular, said connecting section may tear inward from the side edges K1, K2. Conductor tracks of the printed circuit board L can be damaged as a result, this generally leading to malfunctioning or breakdown of the control unit ECU.

The mechanical loading of the connecting section V can lead to its structural integrity being adversely affected immediately after the bending process. Therefore, the method for producing the printed circuit board L preferably comprises a method for testing the printed circuit board L, which method preferably follows bending of the connecting section and with which method the structural integrity of the connecting section V is tested.

The mechanical loading of the connecting section V during operation of the control unit ECU—for example due to vibrations during operation of the motor vehicle in which the control unit ECU is installed—can also have or amplify an adverse effect on the structural integrity of the connecting section V. Therefore, a method according to the invention for operating the control unit preferably likewise comprises a method for testing the printed circuit board L, with which method the structural integrity of the connecting section V is tested.

To this end, the connecting section V has, in addition to a large number of signal lines SIG by means of which, for example, electrical signals are conducted from components—such as the integrated circuit IC—on the first main section H1 to the plug connector ST on the second main section H2 or vice versa, a plurality of monitoring conductor tracks S1, S1', S2. The monitoring lines S1, S1', S2 run from the first main section H1, through the connecting section V, to the second main section H2. After bending of the connecting section, the monitoring conductor tracks S1, S1', S2 of the bent connecting section V follow suit, so that they run through said connecting section in a curved manner. The monitoring conductor tracks S1, S1', S2 are preferably DC-isolated from the plug-in connector ST, but are connected to the integrated circuit IC.

In the present case, the printed circuit board L has three circuit planes E1, E2, E3 which extend from the first main section H1, beyond the connecting section V, to the second main section H2. An additional circuit plane E4 of the printed circuit board is arranged in a layer of the printed circuit board main body which is removed in the connecting section V, so that said additional circuit plane is present only in the region of the two main sections H1, H2 but not in the connecting section V.

Each of the circuit planes E1, E2, E3 which extend across the connecting section V has two monitoring conductor tracks S1, S1', S2, specifically in each case a first monitoring conductor track S1, S1' which runs along the first longitudinal edge K1 and is adjacent to it and a second monitoring conductor track S2 which runs along the second longitudinal edge K2 and is adjacent to it. From amongst these conductor tracks, the first and the second monitoring conductor track S1, S2 of the first circuit plane E1 can be seen in FIG. 1. The first monitoring conductor track S1 of the exposed first and third circuit planes E1, E3 can be seen in FIG. 2. The first monitoring conductor track of the second circuit plane E2 (indicated using dashed lines in FIG. 2) is embedded in the resin of the printed circuit board L.

There are no further conductor tracks of the respective circuit plane E1, E2, E3, in particular no signal lines SIG, arranged between the first monitoring conductor tracks S1, S1' and the first longitudinal edge K1 of the connecting section. Similarly, there are no further conductor tracks of the respective circuit plane E1, E2, E3, in particular no signal lines SIG, arranged between the second monitoring conductor tracks S2 and the second longitudinal edge K2 of the connecting section V. Therefore, the first monitoring conductor tracks S1, S1' precede the signal lines SIG and the second monitoring conductor tracks S2 follow the signal lines SIG in the direction from the first longitudinal edge K1 to the second longitudinal edge K2.

The monitoring conductor tracks S1, S1', S2 have a shape which follows the contour of the longitudinal edges K1, K2. In particular, they have an edge which faces the adjacent longitudinal edge K1 or K2 and has curved regions in transition sections TR1, TR2 from the connecting section V to the main sections H1, H2 and a straight edge which is averted from the respectively adjacent longitudinal edge K1 or K2. In this way, the monitoring conductor tracks S1, S1', S2 have, in the connecting section, a comparatively low width B1 which increases in size along the transition regions TR1, TR2 to the first and, respectively, second main section H1 and, respectively, H2 to a larger width B2.

Electrical measurement values are detected in the method for testing the printed circuit board L, wherein each detected electrical measurement value is representative of the integrity of one of the monitoring conductor tracks S1, S1', S2. During the method for producing the printed circuit board L, this can be performed, for example, by making contact with test points of the monitoring conductor tracks S1, S1', S2 by means of test pins, wherein the test pins are connected to a test system. The test system measures, in particular, the resistances of the monitoring conductor tracks S1, S1', S2 which are connected by means of the test pins.

If the method for testing the printed circuit board L is executed during operation of the control unit, the monitoring conductor tracks S1, S1', S2 are preferably connected to the integrated circuit IC and the electrical measurement values which are representative of the integrity of the monitoring conductor tracks S1, S1', S2 are detected and analyzed by means of the integrated circuit IC. An output signal which is representative of the integrity of the monitoring conductor tracks S1, S1', S2 is preferably provided by the integrated circuit IC to the plug-in connector ST by means of the signal lines SIG.

The invention is not restricted to the exemplary embodiments by the description thereof. Instead, the invention comprises each new feature and each combination of features, which contains, in particular, each combination of features in the exemplary embodiments and patent claims.

The invention claimed is:

1. A method for testing a printed circuit board, the method comprising the following steps:
providing a printed circuit board having a first main section, a second main section, a bent connecting section and at least one monitoring conductor track, the printed circuit board including a first transition region from the connecting section to the first main section and a second transition region from the connecting section to the second main section, the at least one monitoring conductor track having a width being increased in size in the transition regions as compared to other regions;
placing the connecting section between the first main section and the second main section;
extending the monitoring conductor track from the first main section, in a curved manner through the connecting section, to the second main section; and
detecting at least one electrical measurement value being representative of an integrity of the at least one monitoring conductor track, said at least one electrical measurement value including the electrical resistance of the monitoring conductor track.

2. A method for operating an electronic control unit, the method comprising the following steps:
providing a printed circuit board according to claim 1 having the first main section, the second main section, the bent connecting section, the at least one monitoring conductor track, and an integrated circuit disposed at the first main section;
testing the printed circuit board; and
using the integrated circuit to detect the measurement value during operation of the control unit.

3. The method according to claim 2, which further comprises:
analyzing the at least one measurement value by using the integrated circuit; and
using the control unit to provide an output signal being representative of the integrity of the at least one monitoring conductor track.

4. The method according to claim 2, which further comprises providing the printed circuit board with a multiplicity of signal lines, and placing a first monitoring conductor track along a first longitudinal edge of the connecting section between the signal lines and the first longitudinal edge.

5. The method according to claim 4, which further comprises:
placing a second monitoring conductor track along a second longitudinal edge disposed opposite the first longitudinal edge, with the first monitoring conductor track preceding the signal lines and the second monitoring conductor track following the signal lines in a direction from the first longitudinal edge to the second longitudinal edge; and
detecting the at least one electrical measurement value being representative of the integrity of the at least one monitoring conductor track by detecting a measurement value being representative of an integrity of the second monitoring conductor track.

6. The method according to claim 2, which further comprises:
providing the connecting section with a plurality of circuit planes, each of the circuit planes containing a monitoring conductor track; and
detecting the at least one electrical measurement being representative of the integrity of the at least one monitoring conductor track by detecting a measurement value being representative of an integrity of each of the monitoring conductor tracks.

7. The method according to claim 1, which further comprises providing the printed circuit board with a multiplicity of signal lines, and placing a first monitoring conductor track along a first longitudinal edge of the connecting section between the signal lines and the first longitudinal edge.

8. The method according to claim 7, which further comprises:
placing a second monitoring conductor track along a second longitudinal edge disposed opposite the first longitudinal edge, with the first monitoring conductor track preceding the signal lines and the second monitoring conductor track following the signal lines in a direction from the first longitudinal edge to the second longitudinal edge; and
detecting the at least one electrical measurement value being representative of the integrity of the at least one monitoring conductor track by detecting a measurement value being representative of an integrity of the second monitoring conductor track.

9. The method according to claim 1, which further comprises:
providing the connecting section with a plurality of circuit planes, each of the circuit planes containing a monitoring conductor track; and
detecting the at least one electrical measurement being representative of the integrity of the at least one monitoring conductor track by detecting a measurement value being representative of an integrity of each of the monitoring conductor tracks.

10. A method for producing a printed circuit board, the method comprising the following steps:
providing a printed circuit board having a first main section, a second main section, a connecting section and at least one monitoring conductor track;
placing the connecting section between the first main section and the second main section;
extending the monitoring conductor track from the first main section, through the connecting section, to the second main section;
providing the printed circuit board with a multiplicity of signal lines connected between an integrated circuit on the first main section and a plug-in connector on the second main section, the monitoring conductor track being DC-isolated from the plug-in connector;
bending the connecting section and thereby curving the at least one monitoring conductor track;
testing the printed circuit board; and
detecting at least one electrical measurement value being representative of an integrity of the at least one monitoring conductor track, after bending the connecting section.

11. The method according to claim 10, which further comprises carrying out the bending step starting from a flat state of the printed circuit board.

12. The method according to claim 10, which further comprises placing a first monitoring conductor track along a first longitudinal edge of the connecting section between the signal lines and the first longitudinal edge.

13. The method according to claim 12, which further comprises:
placing a second monitoring conductor track along a second longitudinal edge disposed opposite the first longitudinal edge, with the first monitoring conductor track preceding the signal lines and the second monitoring conductor track following the signal lines in a direction from the first longitudinal edge to the second longitudinal edge; and detecting the at least one electrical measurement value being representative of the integrity of the at least one monitoring conductor track by detecting a measurement value being representative of an integrity of the second monitoring conductor track.

14. The method according to claim 10, which further comprises:

providing the connecting section with a plurality of circuit planes, each of the circuit planes containing a monitoring conductor track; and detecting the at least one electrical measurement being representative of the integrity of the at least one monitoring conductor track by detecting a measurement value being representative of an integrity of each of the monitoring conductor tracks.

15. A printed circuit board, comprising:
a first main section;
a second main section;
a bent connecting section disposed between said first main section and said second main section;
at least one monitoring conductor track running from said first main section, in a curved manner through said connecting section, to said second main section;
a multiplicity of signal lines connected between an integrated circuit on said first main section and at least one plug-in connector on said second main section;
said signal lines connected to external electrical connections of the plug-in connector; and
said at least one monitoring conductor track being DC-isolated from the plug-in connector.

16. The printed circuit board according to claim 15, wherein said connecting section is semi-flexible.

17. The printed circuit board according to claim 15, wherein said at least one monitoring conductor track includes a plurality of monitoring conductor tracks, said connecting section has a plurality of circuit planes, and each of said circuit planes contains a respective one of said monitoring conductor tracks.

18. The printed circuit board according to claim 15, which further comprises a first transition region from said connecting section to said first main section and a second transition region from said connecting section to said second main section, said at least one monitoring conductor track having a width being increased in size in said transition regions as compared to other regions.

19. The printed circuit board according to claim 15, wherein:

said at least one monitoring conductor track including a first monitoring conductor track and a second monitoring conductor track;

said connecting section having first and second mutually opposite longitudinal edges;

said first monitoring conductor track running along said first longitudinal edge of said connecting section and being disposed between said signal lines and said first longitudinal edge;

said second monitoring conductor track running along said second longitudinal edge; and said first monitoring conductor track preceding said signal lines and said second monitoring conductor track following said signal lines in a direction from said first longitudinal edge to said second longitudinal edge.

20. A control unit, comprising:
a printed circuit board according to claim 15;
the control unit being configured to detect at least one electrical measurement value being representative of an integrity of said at least one monitoring conductor track.

21. The control unit according to claim 20, wherein:
the at least one plug-in connector has external electrical connections
said printed circuit board including signal lines connected to said external electrical connections of said plug-in connector; and
said at least one monitoring conductor track of said printed circuit board including a first monitoring conductor track and a second monitoring conductor track being DC-isolated from said at least one plug-in connector.

* * * * *